US011004999B2

(12) United States Patent
Dong et al.

(10) Patent No.: US 11,004,999 B2
(45) Date of Patent: May 11, 2021

(54) PHOTODETECTOR ELEMENT (71) Applicant: HAMAMATSU PHOTONICS K.K., Hamamatsu (JP)

(72) Inventors: Wei Dong, Hamamatsu (JP); Hiroyasu Fujiwara, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 0 days.

(21) Appl. No.: 16/353,112

(22) Filed: Mar. 14, 2019

(65) Prior Publication Data

US 2019/0296176 A1 Sep. 26, 2019

(30) Foreign Application Priority Data

Mar. 22, 2018 (JP) .............................. JP2018-054475

(51) Int. Cl.
H01L 31/108 (2006.01)
B82Y 40/00 (2011.01)

(52) U.S. Cl.
CPC .......... H01L 31/1085 (2013.01); B82Y 40/00 (2013.01)

(58) Field of Classification Search
CPC ........... H01L 31/1085; H01L 31/02327; H01L 31/03529
See application file for complete search history.

(56) References Cited

U.S. PATENT DOCUMENTS

2015/0228837 A1* 8/2015 Chen ..................... H01L 31/108
257/455
2015/0280034 A1* 10/2015 Lo ................... H01L 31/035227
257/463

FOREIGN PATENT DOCUMENTS

JP 4789752 B2 10/2011
JP 5437486 B2 3/2014

* cited by examiner

Primary Examiner — Changhyun Yi
(74) Attorney, Agent, or Firm — Faegre Drinker Biddle & Reath LLP (57) ABSTRACT A photodetector element according to an aspect of the present disclosure includes a semiconductor layer with an uneven structure on one surface side that is constituted of projection portions and recess portions, and converts light into surface plasmons, and a metal film that is provided on the one surface side of the semiconductor layer in a manner corresponding to the uneven structure and a Schottky junction is formed between the metal film and the semiconductor layer. The semiconductor layer is constituted of n-type conductive silicon, and the other surface side of the semiconductor layer serves as an incident surface for light. The metal film is constituted of a material including nickel which form the Schottky junction when combined with the semiconductor layer.

9 Claims, 7 Drawing Sheets

PHOTODETECTOR ELEMENT

TECHNICAL FIELD

The present disclosure relates to a photodetector element.

BACKGROUND

In the field of light detection, there is an increasing demand for a technology capable of detecting near-infrared light at low cost. Detection of near-infrared light is expected to be applied to autonomous driving technologies of automobiles, for example. Examples of photodetector elements in the related art capable of detecting near-infrared light include a photodetector element using a compound semiconductor including elements of Group II to Group VI. However, the step of manufacturing a photodetector element using a compound semiconductor has been complicated and expensive. Moreover, in a general pn junction-type photodetector element, it is difficult to detect light having a longer wavelength (for example, 1,100 mu or longer) than the bandgap of silicon. Even in a photodetector element using black silicon, the detection limit on a long wavelength side is approximately 1,200 nm.

On the other hand, in a Schottky-type photodetector element using a Schottky junction, free electrons are excited due to light absorption inside a metal film, and generated excited electrons (that is, hot carriers) pass over a Schottky barrier and flow to a semiconductor side as a photocurrent. Since the detection limit on the long wavelength side is determined based on the height of the Schottky barrier, light having a longer wavelength than the bandgap of silicon can be detected. Japanese Patent No. 5437486 and Japanese Patent No. 4789752 disclose a photodetector element as an example of such Schottky-type photodetector elements. In these photodetector elements in the related art, a metal film, which forms a Schottky junction with the semiconductor layer, and a periodic uneven structure are provided on a front surface side of a semiconductor layer.

SUMMARY

The sensitivity (that is, amount of photocurrent) of the Schottky junction-type photodetector element described above is expressed by the product of the number of generated hot carriers, the probability that the hot carriers will reach a Schottky barrier, and the probability that the hot carriers will pass over the Schottky barrier. Since the number of generated hot carriers depends on the amount of light absorption in a metal film, it is effective to improve the amount of light absorption in order to improve the sensitivity of a photodetector element.

On the other hand, for example, as in the photodetector element disclosed in Japanese Patent No. 5437486, when a metal film (that is, conductive layer) is provided between a semiconductor layer and a periodic uneven structure (that is, metal nanostructure), and light is incident from the uneven structure side. The thickness of the metal film is considered to be reduced in order to have a large amount of light being incident on a Schottky junction surface between the semiconductor layer and the metal film. However, if the thickness of the metal film is reduced in this manner, there is a risk such as disconnection or high resistance. Therefore, in such a case, there is concern that hot carriers generated due to light absorption inside the metal film will vanish before reaching a Schottky electrode (that is, second electrode) and the sensitivity of a photodetector element will deteriorate.

On the other hand, for example, in the photodetector element disclosed in Japanese Patent No. 4789752, a semiconductor layer (that is, semiconductor light receiving layer) is formed as a film by a deposition method such as sputtering, which may lead to deterioration in quality of a Schottky junction surface between the semiconductor layer and a metal film.

The present disclosure is made in order to solve the foregoing problems, and an object thereof is to provide a photodetector element which can detect near-infrared light with sufficient sensitivity at low cost.

In the course of studying photodetector elements, the applicant focused on a combination of a material of a semiconductor layer and a material of a Schottky electrode in order to realize a photodetector element having further improved sensitivity. The applicant made a prototype photodetector element in which an n-type conductive silicon (Si) substrate was used as a semiconductor layer, a titanium (Ti)/gold (Au) electrode was used as a Schottky electrode, and a nickel (Ni) electrode was used as an ohmic electrode. When an n-type conductive silicon substrate is used as a semiconductor layer in this manner, compared to the case in which a p-type conductive silicon substrate is used as a semiconductor layer, improvement in sensitivity of a photodetector element is expected. However, there was a problem with this photodetector element, in which a Schottky junction between the n-type silicon substrate and the Ti/Au electrode was unstable. Therefore, the applicant searched for the cause of this problem and ascertained that the polarity of diode formed between the n-type silicon substrate and the Ti/Au electrode was reversed, and a junction surface between the nickel electrode used as an ohmic electrode and the n-type silicon substrate was functioning as a Schottky junction surface. Therefore, the applicant made a prototype photodetector element, in which an n-type silicon substrate was used as a semiconductor layer and a nickel electrode was used as a Schottky electrode, and confirmed the sensitivity of this photodetector element. As a result, in this photodetector element, it is ascertained that the sensitivity of the photodetector element is significantly improved compared to the case in which a p-type silicon substrate is used as a semiconductor layer and a Ti/Au electrode is used as a Schottky electrode.

A photodetector element according to an aspect of the present disclosure includes a semiconductor layer having an uneven structure constituted of projection portions and recess portions on one surface side, the uneven structure converting light into surface plasmons, and a metal film that is provided on the one surface side of the semiconductor layer in a manner corresponding to the uneven structure and a Schottky junction is formed between the metal film and the semiconductor layer. The semiconductor layer is constituted of n-type conductive silicon, and the other surface side of the semiconductor layer serves as an incident surface for light. The metal film is constituted of a material including nickel.

In this photodetector element, the semiconductor layer is constituted of n-type conductive silicon, and the metal film forming a Schottky junction between the metal film and the semiconductor layer is constituted of nickel. According to the photodetector element having such a constitution, it is ascertained, based on the foregoing knowledge, that the sensitivity of the photodetector element is significantly improved compared to a photodetector element in which the semiconductor layer is constituted of p-type conductive silicon and a Schottky electrode is constituted of a Ti/Au electrode. Therefore, according to the constitution described above, it is possible to obtain the photodetector element which can detect near-infrared light with sufficient sensitivity. Moreover, since the semiconductor layer is constituted of silicon, the photodetector element can be manufactured at low cost. Moreover, in the photodetector element, the other surface side of the semiconductor layer serves as an incident surface for light, and the metal film constituting the Schottky electrode is provided on one surface side of the semiconductor layer. Accordingly, light incident from the incident surface reaches a Schottky junction surface between the semiconductor layer and the metal film without being blocked by the metal film. Therefore, there is no need to cause the thickness of the metal film to be excessively thin in order to have a large amount of light being incident on this Schottky junction surface, so that a risk such as disconnection or high resistance can be avoided.

The uneven structure may be a periodic uneven structure which periodically has the projection portions and the recess portions. In this case, the surface area of the metal film with respect to incident light can be enlarged, so that the sensitivity of the photodetector element can be improved.

The uneven structure may be a periodic uneven nanostructure in which the projection portions and the recess portions are formed in nano-order. In this case, the surface area of the metal film with respect to incident light can be further enlarged, so that the sensitivity of the photodetector element can be further improved.

The metal film may be provided on the one surface side of the semiconductor layer to cover the entirety of the uneven structure. In this case, the Schottky junction surface between the semiconductor layer and the metal film can be further enlarged, so that the sensitivity of the photodetector element can be further improved.

An insulating film may be provided on a top surface of the projection portion. The metal film may have a first part which covers a bottom surface and an inner wall surface of the recess portion and a second part which covers the insulating film. Compared to a region corresponding to a tip end (that is, top surface) side of the projection portion in the uneven structure, a large amount of light absorption occurs in a region corresponding to a base end side of the projection portion. Therefore, the first part is provided to form a Schottky junction with the bottom surface and the inner wall surface of the recess portion making a high contribution to light absorption. On the other hand, an insulating film not forming a Schottky junction is provided on the top surface of the projection portion making a low contribution to light absorption. Accordingly, a Schottky junction area between the semiconductor layer and the metal film is reduced, so that near-infrared light can be detected with sufficient sensitivity while a dark current is suppressed.

A thickness of the insulating film may be equivalent to or smaller than a height of the projection portion. In this case, hot carriers generated inside the metal film near the base end side of the projection portion can reach not only the Schottky junction surface formed on the bottom surface of the recess portion but also the Schottky junction surface formed in a region of the semiconductor layer on the inner wall surface of the recess portion. Therefore, the sensitivity of the photodetector element can be further improved.

A refractive index of the insulating film may be smaller than a refractive index of the semiconductor layer. In this case, light can be easily confined in the first part of the metal film, so that the efficiency of light absorption can be further improved.

The metal film may be configured to include a first film on the semiconductor layer and a second film provided to cover the first film, the first film being constituted of nickel, the second film being constituted of a material having a smaller refractive index than that of the first film. In this case, light can be confined near a boundary surface between the metal film and the semiconductor layer, so that the amount of light absorption can be further improved.

A thickness of the metal film may be 20 nm or larger. When the thickness of the metal film is 20 nm or larger, the effective amount of light absorbed in the metal film is maximized, so that the sensitivity of the photodetector element can be improved.

According to the present disclosure, near-infrared light can be detected with sufficient sensitivity at low cost.

DETAILED DESCRIPTION

Hereinafter, preferable embodiments of a photodetector element according to an aspect of the present disclosure will be described in detail with reference to the drawings. The present disclosure is not limited to these examples. It is intended that the present disclosure is indicated by the claims and includes all of changes within the meaning and the scope equivalent to the claims. In the following description, the same reference signs are applied to the same elements and duplicated description thereof will be omitted in description of the drawings.

First Embodiment

Figure 1:
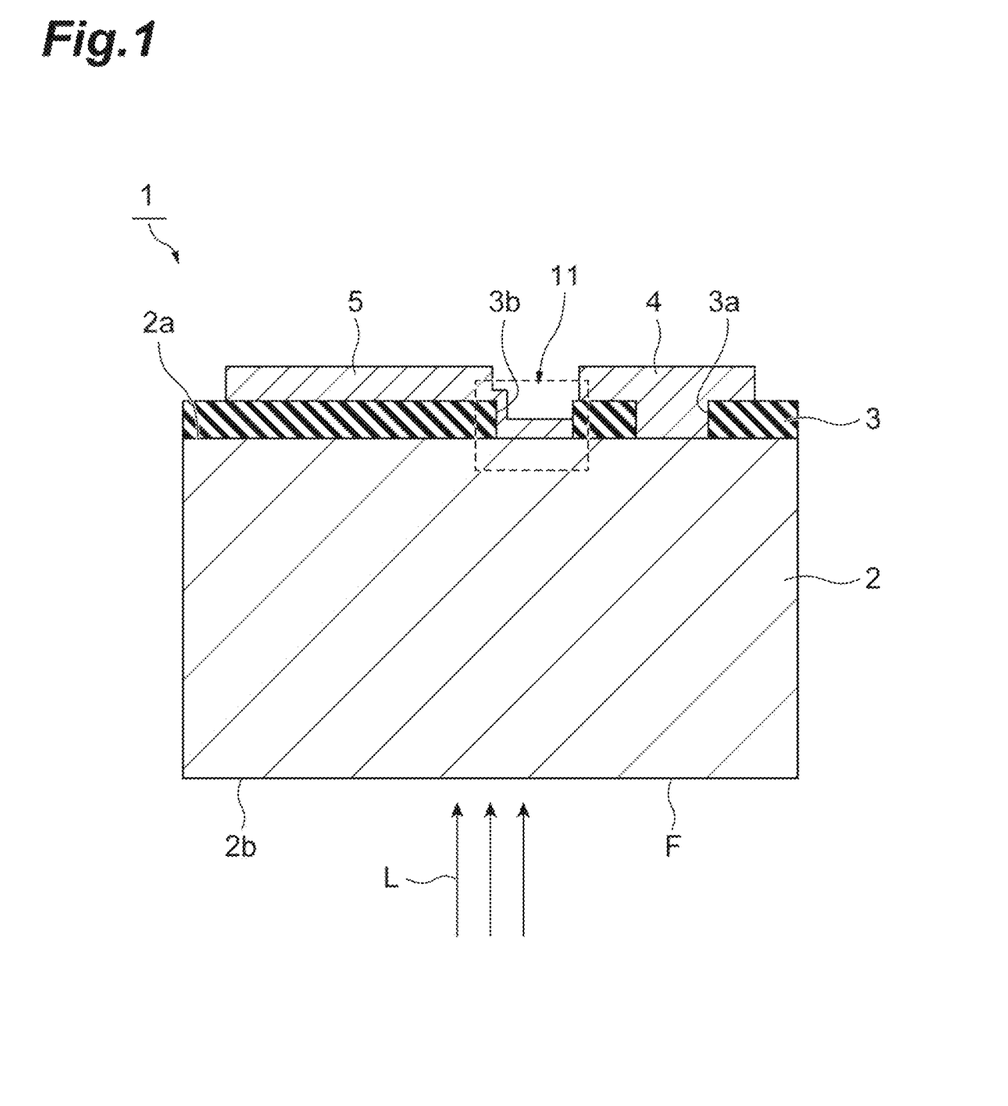
FIG. 1 is a cross-sectional view illustrating a first embodiment of a photodetector element.

FIG. 1 is a cross-sectional view illustrating a photodetector element 1 according to a first embodiment. For example, this photodetector element 1 is constituted as a Schottky junction-type photodetector element used in detection of near-infrared light having a wavelength of 1,200 nm or longer. As illustrated in FIG. 1, the photodetector element 1 includes a semiconductor layer 2, an insulating film 3, an ohmic electrode 4, and a Schottky electrode 5.

The semiconductor layer 2 is a semiconductor layer formed of n-type conductive silicon (Si). The semiconductor layer 2 has a front surface 2a and a rear surface 2b which is positioned on a side opposite to the front surface 2a. The photodetector element 1 is a rear surface incident-type photodetector element, and the rear surface 2b of the semiconductor layer 2 serves as an incident surface F for light L detected by the photodetector element 1.

For example, the insulating film 3 is formed of silicon dioxide ($SiO_2$) on the front surface 2a of the semiconductor layer 2. The thickness of the insulating film 3 is approximately 100 nm, for example. An opening portion 3a for realizing an ohmic junction between the ohmic electrode 4 and the semiconductor layer 2, and an opening portion 3b for realizing a Schottky junction between the Schottky electrode 5 and the semiconductor layer 2 are provided in the insulating film 3. The insulating film 3 is formed by using a chemical vapor deposition method, for example. Photolithography is used, for example, for forming the opening portions 3a and 3b.

The ohmic electrode 4 is formed of a material including gold (Au), germanium (Ge), indium (In), platinum (Pt), and titanium (Ti), for example. The ohmic electrode 4 is provided to cover the opening portion 3a of the insulating film 3 on the front surface 2a of the semiconductor layer 2 and forms an ohmic junction with the semiconductor layer 2 on the bottom surface of the opening portion 3a. The Schottky electrode 5 is formed of nickel (Ni). The Schottky electrode 5 is provided to cover the opening portion 3b of the insulating film 3 on the front surface 2a of the semiconductor layer 2 and forms a Schottky junction with the semiconductor layer 2 on the bottom surface of the opening portion 3b. The ohmic electrode 4 and the Schottky electrode 5 are formed by using a vacuum evaporation method, for example. Since the semiconductor layer 2 is an n-type conductive layer, when the photodetector element 1 is in operation, a bias voltage is applied such that the electric potential on the Schottky electrode 5 becomes lower than the electric potential on the ohmic electrode 4. There are also cases in which the bias voltage is zero.

Figure 2:
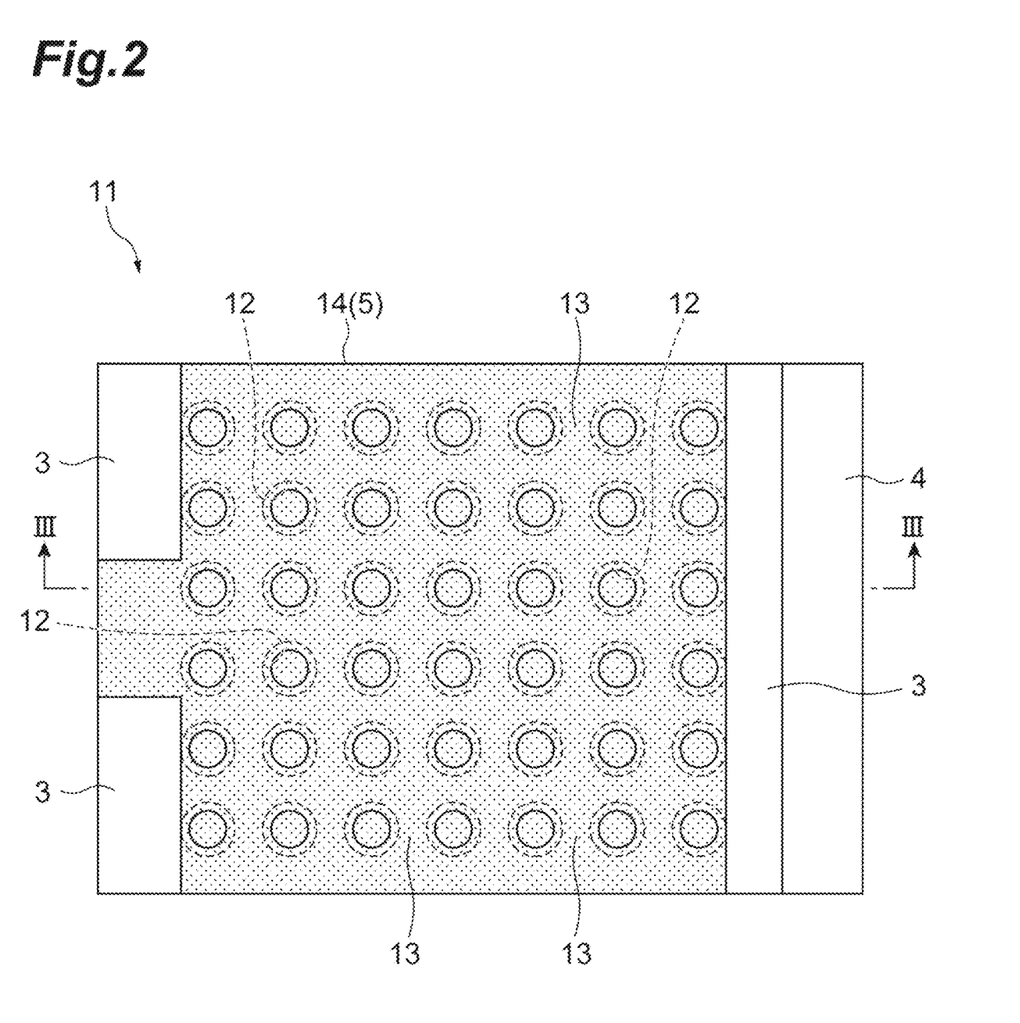
FIG. 2 is an enlarged plan view of a main portion illustrating an arrangement pattern of recess portions in the vicinity of a periodic uneven structure in the photodetector element illustrated in FIG. 1.
Figure 3:
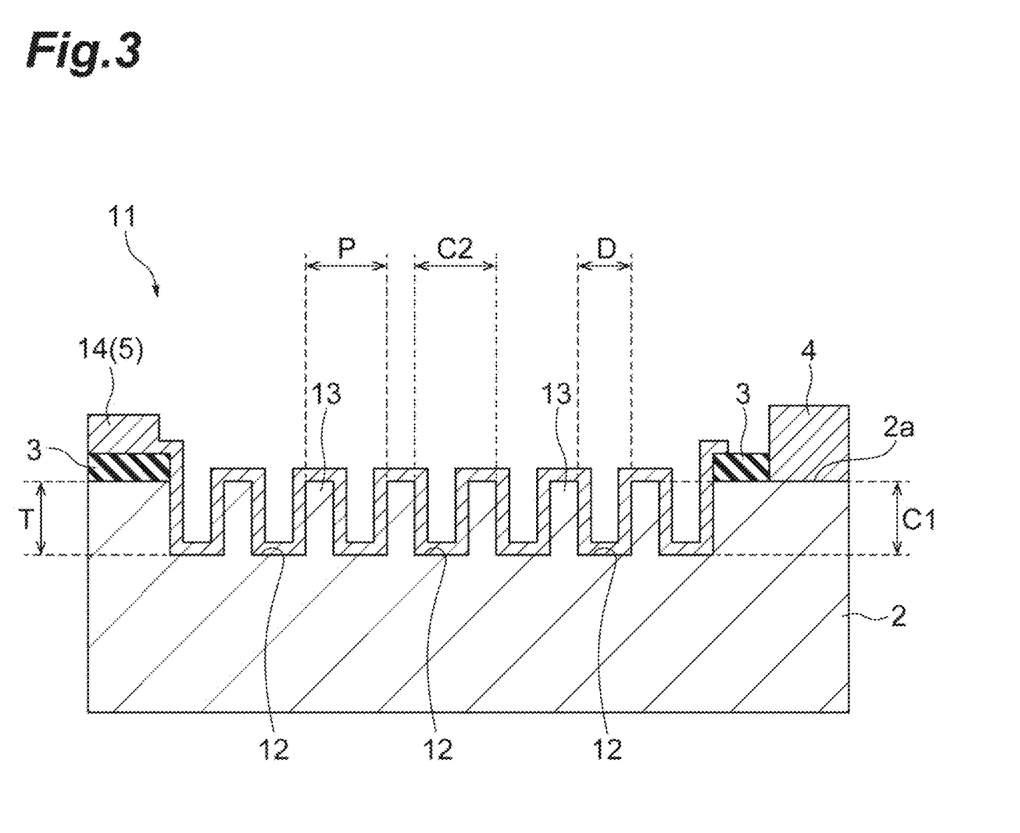
FIG. 3 is a cross-sectional view taken along line in FIG. 2.

On the front surface 2a of the semiconductor layer 2, a periodic uneven nanostructure 11 which converts the light L incident from the incident surface F into surface plasmon is provided at a position corresponding to the opening portion 3b of the insulating film 3. FIG. 2 is an enlarged plan view of a main portion illustrating a configuration in the vicinity of the periodic uneven nanostructure 11 (that is, dotted line part in FIG. 1). FIG. 3 is a cross-sectional view taken along line III-III in FIG. 2. As illustrated in FIGS. 2 and 3, for example, the periodic uneven nanostructure 11 has recess portions 12 and projection portions 13 which are formed in nano-order in a region equivalent to or larger than the spot size of the light L incident from the incident surface. The uneven pattern due to the recess portions 12 and the projection portions 13 is formed by an electron beam exposure method, a method in which nanoimprint lithography and reactive ion etching or lifting-off are combined, or a direct processing method using a focused ion beam, for example.

In the present embodiment, as illustrated in FIG. 2, the recess portions 12 constituting the periodic uneven nanostructure 11 have a matrix arrangement pattern in a plan view. In the example in FIG. 2, the array pitch of the recess portions 12 in the row direction and the array pitch thereof in the column direction coincide with each other. The recess portion 12 has a columnar shape. A cross-sectional shape of the recess portion 12 is a circular shape, and a vertical-sectional shape of the recess portion 12 is a rectangular shape (refer to FIG. 3). Due to such an arrangement pattern, as illustrated in FIG. 3, the periodic uneven nanostructure 11 constitutes a vertical resonator C1 and a traverse resonator C2 with respect to the light L incident from the incident surface F. The vertical resonator C1 is a resonator formed in the height direction of the unevenness and is constituted of the bottom surfaces of the projection portions 13 and the top surfaces of the projection portions 13. The traverse resonator C2 is a resonator formed in the array direction of the unevenness and is constituted of an inner wall surface of the recess portion 12 and an inner wall surface at the corresponding position of the adjacent recess portion 12.

In the periodic uneven nanostructure 11, heights T of the projection portions 13 (that is, the depths of the recess portions 12), an array pitch P of the projection portions 13, and widths D of the recess portions are set such that the resonance wavelength of the vertical resonator C1 and the resonance wavelength of the traverse resonator C2 are aligned with each other, for example. More specifically, when the wavelengths of surface plasmons generated in the periodic uneven nanostructure 11 are $\lambda p$, the heights T of the projection portions 13 satisfy $3/8 \lambda p < T < 5/8 \lambda p$, and the array pitch P of the projection portions 13 satisfies $9/10 \lambda p < P < 11/10 \lambda p$. The widths D of the recess portions 12 (here, the diameters of the recess portions 12) satisfy $50 \text{ nm} < D < \lambda p - 50 \text{ nm}$. Here, these ranges are merely examples. The heights T of the projection portions 13, the array pitch P of the projection portions 13, and the widths D of the recess portions may be set to be other than the foregoing ranges.

As illustrated in FIG. 2, a metal film 14 constituting the Schottky electrode 5 is provided on the front surface 2a side of the semiconductor layer 2 to cover the entirety of the periodic uneven nanostructure 11. Specifically, the metal film 14 covers the top surfaces of the projection portions 13, the bottom surfaces of the recess portions 12, and the inner wall surfaces of the recess portions 12 in the periodic uneven nanostructure 11. In the periodic uneven nanostructure 11, the semiconductor layer 2 and the metal film 14 form a Schottky junction. Along with the formation of the Schottky junction with the metal film 14, a depletion region is formed in the vicinity of the Schottky junction surface inside the semiconductor layer 2. The light L incident from the incident surface F is confined by the vertical resonator C1 and the traverse resonator C2 and is converted into surface plasmons propagating through the front surface of the metal film 14. Due to the resonance between the surface plasmons and the light L, energy of the light L is absorbed in the metal film 14. Then, free electrons are excited due to light absorption inside the metal film 14, and generated hot carriers pass over the Schottky barrier and flow as a photocurrent into the semiconductor layer 2 side.

In the present embodiment, in order to improve the efficiency of light absorption in the metal film 14, the thickness of the metal film 14 is set to 20 nm or larger. The sensitivity (that is, amount of photocurrent) of a Schottky junction-type photodetector element is expressed by the product of the number of generated hot carriers, the probability that the hot carriers will reach the Schottky barrier, and the probability that the hot carriers will pass over the Schottky barrier. Since the number of generated hot carriers depends on the amount of light absorption in a metal film, it is effective to improve the amount of light absorption in the metal film in order to improve the sensitivity of a photodetector element.

The probability of transportation from an excited electron generation position (that is, the probability of traveling a distance r) is expressed by $\exp(-r/L)$. The factor L indicates the mean free path inside a metal film, which is approximately 30 nm. When the shortest distance from the excited electron generation position to a boundary surface of the semiconductor layer is z, the distance z becomes a distance of a perpendicular line connecting the excited electron generation position and the boundary surface of the semiconductor layer to each other. Therefore, when the angle formed by the traveling direction of excited electrons and the perpendicular line is θ, the probability of transportation of the excited electrons becomes exp(−z/Lcos θ). An integrated value obtained by multiplying the amount of light absorption inside an electrode film by the probability of transportation at the excited electron generation position and further performing volume integration over the entirety of the inside of the electrode film (hereinafter, the integrated value will be referred to as an "effective amount of absorption") becomes a value proportional to the sensitivity of the Schottky junction-type photodetector element.

Here, in the course of studying photodetector elements, the applicant focused on a combination of a material of a semiconductor layer and a material of a Schottky electrode in order to realize a photodetector element having further improved sensitivity. The applicant made a prototype photodetector element using a semiconductor layer constituted of n-type conductive silicon (Si), a Schottky electrode constituted of titanium (Ti)/gold (Au), and an ohmic electrode constituted of nickel (Ni). When a semiconductor layer constituted of n-type conductive silicon is used, compared to the case in which a semiconductor layer constituted of p-type silicon is used, improvement in sensitivity of a photodetector element is expected.

However, there was a problem with this photodetector element, in which a Schottky junction between the semiconductor layer and the Schottky electrode was unstable. Therefore, the applicant searched for the cause of this problem and ascertained that the polarity of diode formed between the semiconductor layer and the Schottky electrode was reversed, and a junction surface between the semiconductor layer and the ohmic electrode was functioning as a Schottky junction surface. Therefore, the applicant made a prototype photodetector element, in which a semiconductor layer constituted of n-type silicon and a Schottky electrode constituted of nickel were used, and confirmed the sensitivity of this photodetector element. As a result, in this photodetector element, it is ascertained that the sensitivity of the photodetector element is significantly improved compared to the case in which a semiconductor layer constituted of p-type silicon and a Schottky electrode constituted of Ti/Au are used. Measurement results of the sensitivity of the photodetector element will be described below.

In the photodetector element 1 according to the present embodiment, the semiconductor layer 2 is constituted of n-type conductive silicon, and the metal film 14 constituting the Schottky electrode 5 is constituted of nickel. Therefore, compared to a photodetector element in which a semiconductor layer is constituted of p-type conductive silicon and a Schottky electrode is constituted of a Ti/Au electrode, it is ascertained, based on the foregoing knowledge, that the sensitivity of the photodetector element 1 is significantly improved. Therefore, according to the constitution described above, it is possible to obtain the photodetector element 1 which can detect near-infrared light with sufficient sensitivity.

Moreover, since the semiconductor layer 2 is constituted of silicon, the photodetector element 1 can be manufactured at low cost. Moreover, in the photodetector element 1, the rear surface 2b side of the semiconductor layer 2 serves as the incident surface F for the light L, and the metal film 14 constituting the Schottky electrode 5 is provided on the front surface 2a side of the semiconductor layer 2. Accordingly, the light L incident from the incident surface F reaches the Schottky junction surface between the semiconductor layer 2 and the metal film 14 without being blocked by the metal film 14. Therefore, there is no need to make the thickness of the metal film 14 to be excessively thin in order to have a large amount of the light L being incident on this Schottky junction surface, so that a risk such as disconnection or high resistance can be avoided.

In the present embodiment, the periodic uneven nanostructure 11 is a periodic uneven structure which periodically has the projection portions 13 and the recess portions 12. Accordingly, the surface area of the metal film 14 with respect to the incident light L can be enlarged, so that the sensitivity of the photodetector element 1 can be improved.

In the present embodiment, the periodic uneven nanostructure 11 is a periodic uneven nanostructure in which the projection portions 13 and the recess portions 12 are formed in nano-order. Accordingly, the surface area of the metal film 14 with respect to the incident light L can be further enlarged, so that the sensitivity of the photodetector element 1 can be further improved.

In the present embodiment, the metal film 14 is provided on the front surface 2a side of the semiconductor layer 2 to cover the entirety of the periodic uneven nanostructure 11. Accordingly, the Schottky junction surface between the semiconductor layer 2 and the metal film 14 can be further enlarged, so that the sensitivity of the photodetector element 1 can be further improved.

In the present embodiment, the thickness of the metal film 14 is 20 nm or larger. When the thickness of the metal film 14 is 20 nm or larger, the effective amount of the light L absorbed in the metal film 14 is maximized, so that the sensitivity of the photodetector element 1 can be improved.

In the present embodiment, the recess portions 12 in the periodic uneven nanostructure 11 have a matrix arrangement pattern in a plan view, and a cross-sectional shape of the recess portion 12 is a circular shape (refer to FIG. 2). In this manner, when a matrix arrangement pattern is employed, the light L in all polarization directions is uniformly converted into surface plasmons. Therefore, light can be detected independently of the polarization direction. Moreover, when a circular shape is employed as a cross-sectional shape of the recess portion 12, the area for the light L sensing the periodic characteristics of the periodic uneven nanostructure 11 becomes narrow, so that light is converted into surface plasmons over a wide wavelength range. Therefore, light can be detected over a wide wavelength range.

Second Embodiment

Figure 4:
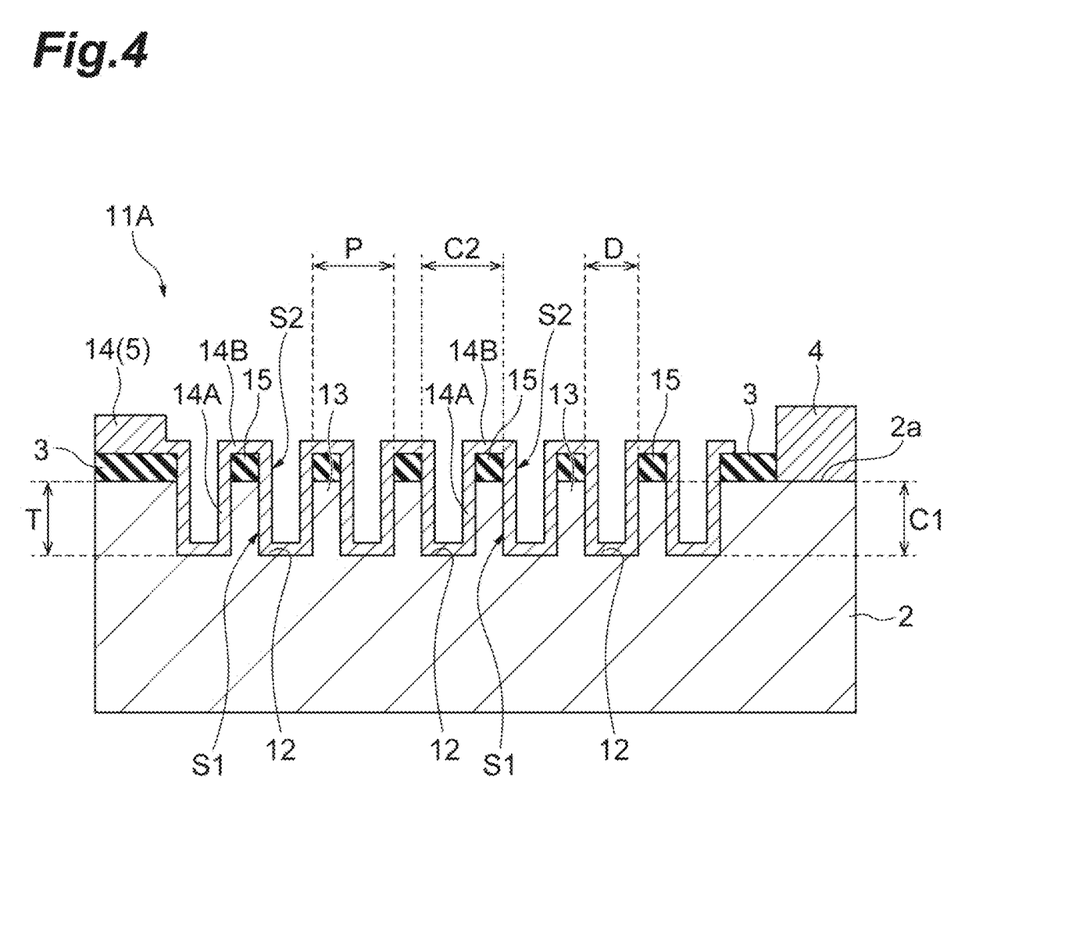
FIG. 4 is an enlarged cross-sectional view of a main portion illustrating a periodic uneven structure according to a second embodiment of a photodetector element.

FIG. 4 is an enlarged cross-sectional view of a main portion illustrating a constitution in the vicinity of a periodic uneven nanostructure 11A according to a second embodiment. The present embodiment differs from the first embodiment in that an insulating film 15 is provided on the top surface of the projection portion 13. The insulating film 15 is patterned on only the top surface of the projection portion 13 using photolithography, for example. The thickness of the insulating film 15 is within a range of 10 nm to 150 nm, for example, and is equivalent to or smaller than the height T of the projection portion 13. The thickness of the insulating film 15 may be equivalent to the thickness of the insulating film 3. It is preferable that the refractive index of the insulating film 15 with respect to the light L be smaller than the refractive index of the semiconductor layer 2 with respect to the light L.

In the present embodiment, similar to the insulating film 3, the insulating film 15 is formed of silicon dioxide ($SiO_2$), for example, and the insulating film, which has been used as a mask when the periodic uneven nanostructure 11A is produced, is utilized as the insulating film 15 without any change. Examples of other constituent materials of the insulating film 15 include magnesium fluoride (MgF$_2$), silicon nitride (SiN), titanium oxide (TiO$_2$), and aluminum oxide (Al$_2$O$_3$).

As illustrated in FIG. 4, the metal film 14 constituting the Schottky electrode 5 is formed to cover the periodic uneven nanostructure 11A and the insulating films 15. The metal film 14 has a first part 14A which covers the bottom surfaces of the recess portions 12 and the inner wall surfaces of the recess portions 12 in the periodic uneven nanostructure 11A, and a second part 14B which covers the insulating films 15 provided on the top surfaces of the projection portions 13. On the base end side of the projection portions 13, a Schottky junction portion S1 is constituted between the bottom surface of the recess portion 12 and the inner wall surface of the recess portion 12, and the first part 14A of the metal film 14. On the tip end side of the projection portions 13, a non-Schottky junction portion S2 is constituted between the insulating film 15 provided on the top surface of the projection portion 13 and the second part 14B of the metal film 14.

Examples of representative characteristics of a photodetector element include a dark current, in addition to sensitivity. Dark currents are currents flowing in a state in which no light is incident on a photodetector element. Since a dark current affects the detection limit of light in a region of low illuminance, it is desirable that the dark current be extremely small, regarding the characteristics of a photodetector element. When a metal film is provided to cover a periodic uneven structure in a photodetector element, a junction surface between the semiconductor layer and the metal film is formed on the bottom surfaces of the recess portions, the inner wall surfaces of the recess portions, and the top surfaces of the projection portions. Accordingly, compared to the areas of the top surfaces of the projection portions and the bottom surfaces of the recess portions which are effective light receiving areas, it is considered that the Schottky junction area between the semiconductor layer and the metal film is enlarged and there is more dark current.

Here, in the course of studying photodetector elements, the applicant ascertained that a dark current can be suppressed while the sensitivity of a photodetector element is maintained, by making a semiconductor layer and a metal film to form a Schottky junction in a region having a large amount of light absorption, and by making the semiconductor layer and the metal film not to form a Schottky junction in a region having a small amount of light absorption.

In the present embodiment, the Schottky junction portions S1 are locally provided on the base end side of the projection portions 13 constituting the periodic uneven nanostructure 11A, and the non-Schottky junction portions S2 are provided on the tip end side of the projection portions 13. As described above, compared to a region corresponding to the tip end side of the projection portions 13 in the periodic uneven nanostructure 11A, a larger amount of light is absorbed in a region corresponding to the base end side of the projection portions 13. Therefore, the Schottky junction area between the semiconductor layer 2 and the metal film 14 is reduced by providing the Schottky junction portion S1 in a region making a high contribution to light absorption and providing the non-Schottky junction portion S2 in a region making a low contribution to light absorption, so that near-infrared light can be detected with sufficient sensitivity while a dark current is suppressed.

Moreover, since the non-Schottky junction portions S2 due to the insulating films 15 are positioned on the top surfaces of the projection portions 13, even if the area of the metal film 14 is enlarged, an increase in the Schottky junction area between the semiconductor layer 2 and the metal film 14 can be avoided, so that design freedom of the metal film 14 can be sufficiently ensured. Moreover, since the second parts 14B of the metal film 14 are positioned on the top surfaces of the projection portions 13, the efficiency of light absorption in the first part 14A of the metal film 14 can be improved due to the reflection of light in the second part 14B. Moreover, since the insulating film used as a mask when the periodic uneven nanostructure 11A is produced can be utilized as the insulating film 15 without any change, the manufacturing step can be simplified.

In the present embodiment, the thickness of the insulating film 15 is equivalent to or smaller than the height T of the projection portion 13. Accordingly, hot carriers generated inside the metal film 14 near the base end side of the projection portions 13 can reach not only the Schottky junction portions S1 on the bottom surfaces of the recess portions 12 but also the Schottky junction portions S1 in the region of the semiconductor layer on the inner wall surfaces of the recess portions 12. Therefore, the sensitivity of the photodetector element 1 can be further improved.

In the present embodiment, the refractive index of the insulating film 15 is smaller than the refractive index of the semiconductor layer 2. Accordingly, light can be easily confined in the first part 14A of the metal film 14, so that the efficiency of light absorption can be further improved.

Third Embodiment

Figure 5:
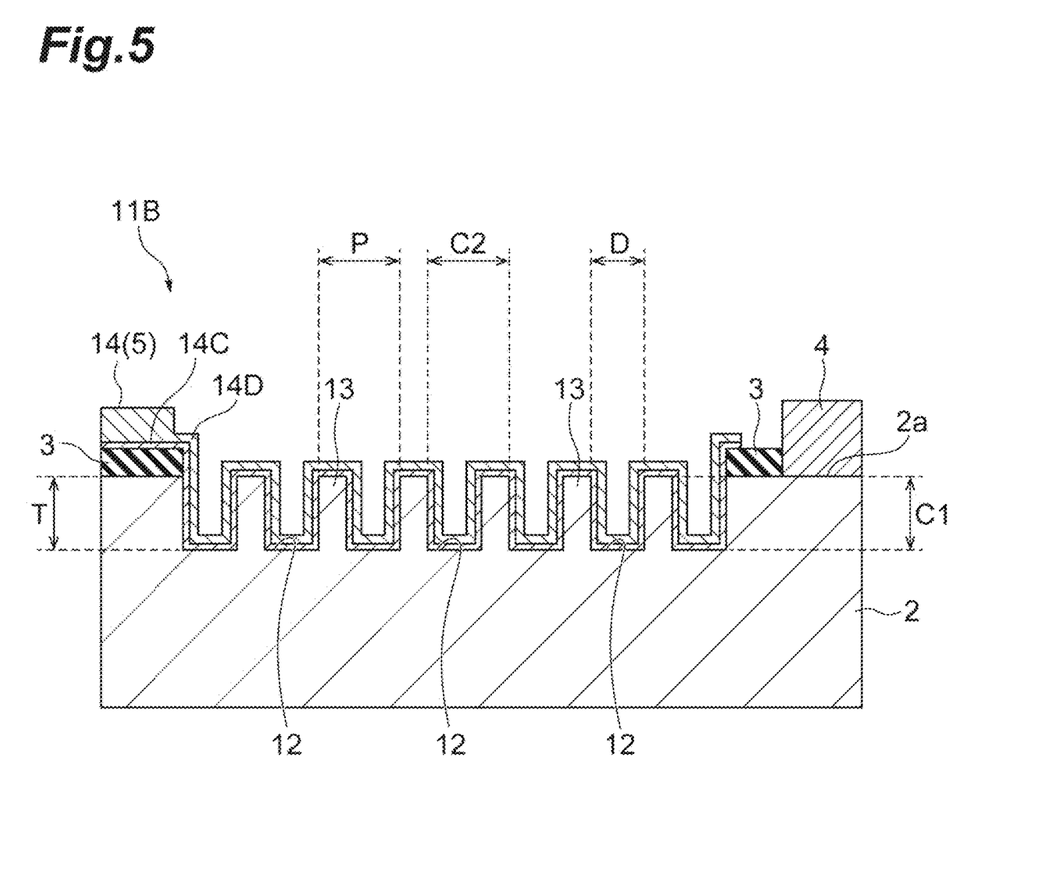
FIG. 5 is an enlarged cross-sectional view of a main portion illustrating a periodic uneven structure according to a third embodiment of a photodetector element.

FIG. 5 is an enlarged cross-sectional view of a main portion illustrating a constitution in the vicinity of a periodic uneven nanostructure 11B according to a third embodiment. The present embodiment differs from the first embodiment in that the metal film 14 is a multilayer film. As illustrated in FIG. 5, the metal film 14 is constituted of films of a plurality of layers including a first film 14C which is provided on the semiconductor layer 2 and a second film 14D which is provided to cover the first film 14C.

The first film 14C covers the entirety of the periodic uneven nanostructure 11B in a manner corresponding to the shape of the periodic uneven nanostructure 11B. That is, the metal film 14 covers the top surfaces of the projection portions 13, the bottom surfaces of the recess portions 12, and the inner wall surfaces of the recess portions 12 in the periodic uneven nanostructure 11B. The second film 14D is provided on the periodic uneven nanostructure 11B with the first film 14C interposed therebetween.

The first film 14C is constituted of nickel (Ni), and the second film 14D is constituted of a material having a smaller refractive index than that of the first film 14C. Examples of materials of the second film 14D include gold (Au) and aluminum (Al). According to such a constitution, light can be confined near the boundary surface between the metal film 14 and the semiconductor layer 2, so that the amount of light absorption can be further improved.

EXAMPLES

For the Examples and a comparative example, the sensitivity of each photodetector element was measured. Example 1 corresponds to the first embodiment. That is, in Example 1, the semiconductor layer was constituted of n-type silicon (Si), and the metal film constituting a Schottky electrode was constituted of nickel (Ni). In the periodic uneven structure of Example 1, the height of the projection portion (that is, the depth of the recess portion) was set to 50 nm, the array pitch of the recess portions was set to 425 nm, and the width (that is, the diameter) of the recess portion was set to 140 nm.

Example 2 corresponds to the second embodiment. That is, in Example 2, the semiconductor layer was constituted of n-type silicon, the metal film constituting a Schottky electrode was constituted of nickel, and an insulating film was provided on the top surface of the projection portion. In the periodic uneven structure of Example 2, the height of the projection portion (that is, the depth of the recess portion) was set to 50 nm, the array pitch of the recess portions was set to 400 nm, and the width (that is, the diameter) of the recess portion was set to 160 nm. The thickness of the insulating film was set to 30 nm.

Example 3 corresponds to the third embodiment. That is, in Example 3, the semiconductor layer was constituted of n-type silicon, the metal film constituting a Schottky electrode was constituted of nickel, and the metal film was constituted of films of a plurality of layers including a first film and a second film. In the periodic uneven structure of Example 3, the height of the projection portion (that is, the depth of the recess portion 12) was set to 50 nm, the array pitch of the recess portions was set to 425 nm, and the width (that is, the diameter) of the recess portion was set to 140 nm. The thickness of the first film was set to 10 nm, and the thickness of the second film was set to 70 nm.

The comparative example differed from Example 1 in that the semiconductor layer was constituted of p-type silicon and the metal film constituting a Schottky electrode was constituted of titanium (TO/gold (Au). However, the configuration was otherwise the same as that of Example 1.

Figure 6:
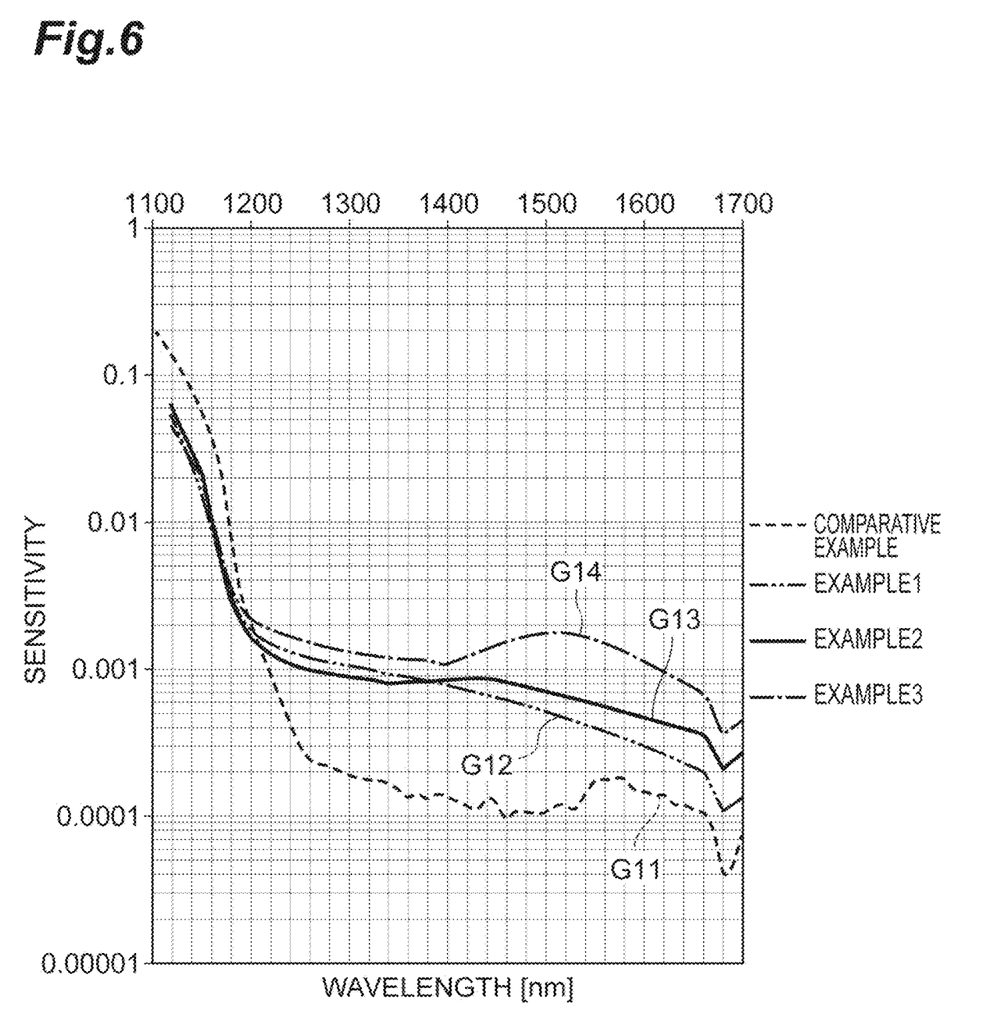
FIG. 6 is a graph showing the sensitivity of photodetector elements according to Examples and the sensitivity of a photodetector element according to a comparative example.

FIG. 6 is a graph showing the sensitivity of a photodetector element according to Examples 1 to 3 and the sensitivity of a photodetector element according to the comparative example. In FIG. 6, the horizontal axis indicates the wavelength, and the vertical axis indicates the logarithm of the sensitivity. The wavelength of the horizontal axis is within a range of 1,100 nm to 1,700 nm, and the sensitivity of the vertical axis is standardized. In FIG. 6, a graph G11 indicates the result of the comparative example, a graph G12 indicates the result of Example 1, a graph G13 indicates the result of Example 2, and a graph G14 indicates the result of Example 3.

As illustrated in FIG. 6, compared to the comparative example (refer to the graph G11) in which the semiconductor layer of p-type silicon and the metal film of Ti/Au were used, in Example 1 (refer to the graph G12) in which the semiconductor layer of n-type silicon and the metal film of nickel were used, it was ascertained that the sensitivity with respect to light having a wavelength of 1,150 nm or longer indicated a higher value by approximately one order of magnitude. In Example 3 (refer to the graph G14), compared to Examples 1 and 2 (refer to the graph G12 and the graph G13), it was ascertained that the sensitivity with respect to light of all of the wavelengths was high. As the reason for this, it was assumed that since the metal film was constituted of films of a plurality of layers including the first film and the second film in Example 3, the amount of light absorption could be further improved as described above.

Modification Example

Figure 7:
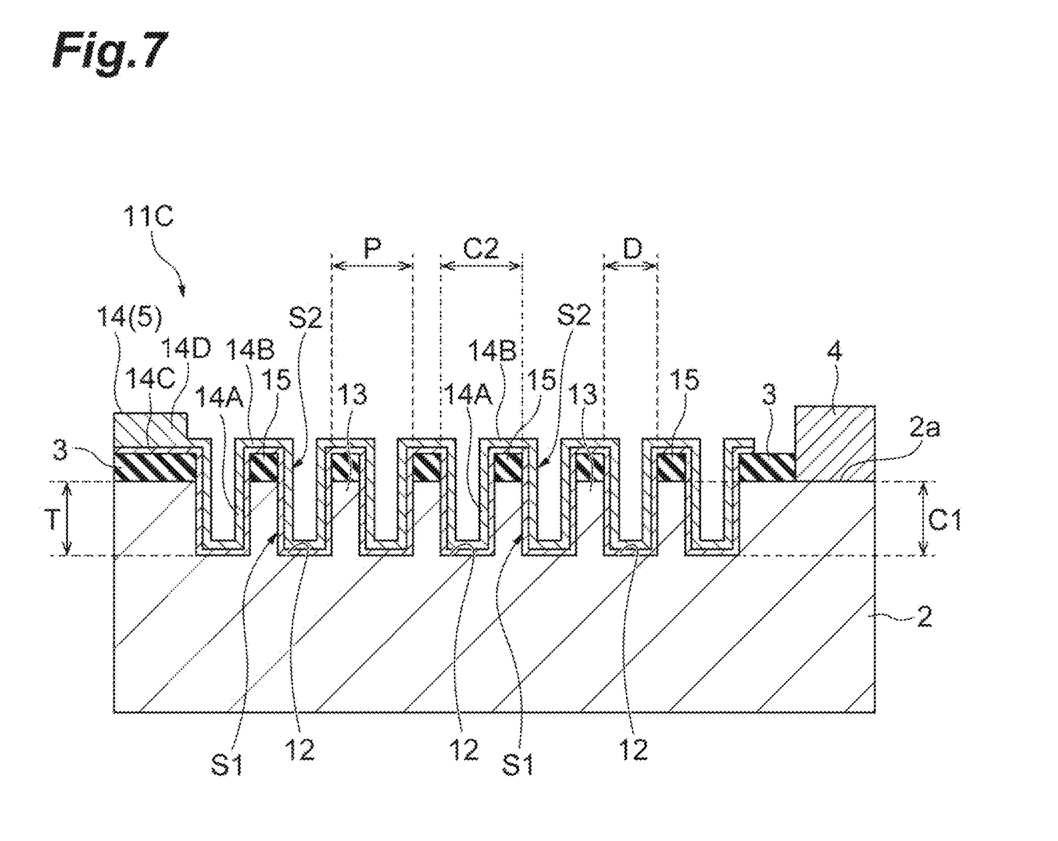
FIG. 7 is an enlarged cross-sectional view of a main portion illustrating a modification example of a periodic uneven structure.

FIG. 7 is an enlarged cross-sectional view of a main portion illustrating a modification example of a periodic uneven nanostructure 11C. The present modification example is an example of a constitution in which the second embodiment and the third embodiment are combined. That is, in the present modification example, the insulating film 15 was provided on the top surface of the projection portion 13 in the periodic uneven nanostructure 11C, and the metal film 14 covering the periodic uneven nanostructure 11C was a multilayer film. As described above, the insulating film 15 was patterned on only the top surface of the projection portion 13 using photolithography, for example. The thickness of the insulating film 15 was within a range of 10 nm to 150 nm, for example, and was equivalent to or smaller than the height T of the projection portion 13.

As illustrated in FIG. 7, the metal film 14 constituting the Schottky electrode 5 has the first part 14A which covers the bottom surfaces of the recess portions 12 and the inner wall surfaces of the recess portions 12 in the periodic uneven nanostructure 11, and the second part 14B which covers the insulating films 15 provided on the top surfaces of the projection portions 13. On the base end side of the projection portions 13, the Schottky junction portion S1 is constituted between the bottom surface of the recess portion 12 and the inner wall surface of the recess portion 12, and the first part 14A of the metal film 14. On the tip end side of the projection portions 13, the non-Schottky junction portion S2 is constituted between the insulating film 15 provided on the top surface of the projection portion 13 and the second part 14B of the metal film 14.

The metal film 14 is a multilayer film constituted of films of a plurality of layers including the first film 14C which is provided on the semiconductor layer 2 and the second film 14D which is provided to cover the first film 14C. As described above, the first film 14C is constituted of nickel (Ni), and the second film 14D is constituted of a material having a smaller refractive index than that of the first film 14C.

According to the present modification example, the Schottky junction portion S1 is provided in a region making a high contribution to light absorption. On the other hand, the non-Schottky junction portion S2 is provided in a region making a low contribution to light absorption. Accordingly, the Schottky junction area between the semiconductor layer 2 and the metal film 14 is reduced, so that near-infrared light can be detected with sufficient sensitivity while a dark current is suppressed. Moreover, since the second film 14D of the metal film 14 is constituted of a material having a smaller refractive index than that of the first film 14C, the amount of light absorption can be further improved.

The present disclosure is not limited to each of the embodiments, Examples, and the modification example described above. For example, the periodic uneven nanostructure 11 does not have to be a structure in which the recess portions 12 and the projection portions 13 are formed in nano-order. That is, the periodic uneven nanostructure 11 may be a periodic uneven structure having the recess portions 12 and the projection portions 13 in a simply periodic manner. Moreover, the periodic uneven nanostructure 11 may be an uneven structure having no periodic characteristics in arrangement of the recess portions 12 and the projection portions 13.

In each of the embodiments, Examples, and the modification example, the ohmic electrode 4 and the Schottky electrode 5 are exposed on the front surface 2a of the semiconductor layer 2. However, an insulating protective film may be formed on the front surfaces of the ohmic electrode 4 and the Schottky electrode 5. In this case, it is possible to achieve technical effects, such as protection of the periodic uneven nanostructure 11 when elements are assembled, and prevention of a short-circuit in the ohmic electrode 4. Moreover, an anti-reflection film may be provided on the incident surface F. Accordingly, incident efficiency of the light L can be improved.

Moreover, the detection region can be widened to a range of near-infrared light to visible light by thinning the semiconductor layer 2. When the semiconductor layer 2 is thinned, the response speed can be improved due to miniaturization of the photodetector element 1, and spatial resolution can also be improved due to the shortened diffusion distance of the light L incident from the incident surface F inside the elements. The semiconductor layer 2 may be thinned over the entirety of the rear surface 2b of the semiconductor layer 2, or only a region corresponding to the periodic uneven nanostructure 11 may be thinned. In the former case, the semiconductor layer 2 may be configured to have a glass substrate provided on the rear surface 2b.

As another application structure, regarding the recess portions 12 arranged in a matrix in the periodic uneven nanostructure 11, the array pitch in the row direction and the array pitch in the column direction may be different from each other. In this case, light of two wavelengths different from each other in the polarization direction can be detected. A photodetector element 1 may be set as an array by providing a plurality of periodic uneven nanostructures 11 on the front surface 2a of the semiconductor layer 2. In this case, a plurality of wavelengths can be detected by changing the array pitch of the recess portions 12 for each periodic uneven nanostructure 11, so that the photodetector element 1 can function as a spectroscopic sensor.

In each of the embodiments, Examples, and the modification example, the recess portions 12 of which the cross-sectional shape is a circular shape are arranged in a matrix in the periodic uneven nanostructure 11. However, the arrangement pattern of the periodic uneven nanostructure 11 is not limited thereto. For example, the recess portions 12 may have a zig-zag arrangement pattern. For example, the cross-sectional shape of the recess portion 12 may be other shapes such as a rectangular shape and a triangular shape. The vertical-sectional shape of the recess portion 12 is not limited to a quadrangular shape, and other shapes such as a trapezoidal shape and a triangular shape may be adopted. The bottom surface of the recess portion 12 is not limited to a flat surface and may have a recessed curve shape or a spherical shape. When a rectangular shape is employed as the cross-sectional shape of the recess portion 12, the area for the light L sensing the periodic characteristics of the periodic uneven nanostructure 11 is widened. Therefore, light is converted into strong surface plasmons in a particular wavelength. Therefore, light can be detected with high sensitivity in a particular wavelength.

The recess portions 12 in the periodic uneven nanostructure 11 may have a stripe arrangement pattern in a plan view. When a stripe arrangement pattern is employed, only the light L of which the electric field vector is orthogonal to the stripe arrangement pattern is converted into strong surface plasmons in the periodic uneven nanostructure 11. Therefore, light can be detected with high sensitivity in one polarization direction. The recess portions 12 in the periodic uneven nanostructure 11 may have a concentrically circular arrangement pattern (not illustrated) in a plan view or may have a concentrically polygonal arrangement pattern in a plan view. When a concentrically circular arrangement pattern is employed, the light L in all polarization directions is uniformly converted into surface plasmons. Therefore, light can be detected independently of the polarization direction. For example, when a concentrically quadrangular arrangement pattern is employed, only the light L of which the electric field vector is orthogonal to one side of the concentrically quadrangular arrangement pattern is converted into strong surface plasmons in the periodic uneven nanostructure 11. Therefore, light can be detected in two polarization directions with high sensitivity.

The recess portions 12 in the periodic uneven nanostructure 11 may have a concentrically circular arrangement pattern in a plan view. When a concentrically circular arrangement pattern is employed, the light L in all polarization directions is uniformly converted into surface plasmons. Therefore, light can be detected independently of the polarization direction.

Moreover, the recess portions 12 in the periodic uneven nanostructure 11 may have a concentrically polygonal arrangement pattern in a plan view. When a concentrically polygonal arrangement pattern is employed, only the light L of which the electric field vector is orthogonal to one side of the concentrically polygonal arrangement pattern is converted into strong surface plasmons in the periodic uneven nanostructure 11. Therefore, light can be detected in two polarization directions with high sensitivity. The shape of the recess portion 12 in the periodic uneven nanostructure 11 is not limited to a concentrically quadrangular shape and may be other polygonal shapes such as a concentrically triangular shape and a concentrically hexagonal shape.

What is claimed is:

1. A photodetector element comprising:
   a semiconductor layer having an uneven structure constituted of projection portions and recess portions on one surface side, the uneven structure converting light into surface plasmons; and
   a metal film that is provided on the one surface side of the semiconductor layer in a manner corresponding to the uneven structure and a Schottky junction is formed between the metal film and the semiconductor layer,
   wherein the semiconductor layer is constituted of n-type conductive silicon, and the other surface side of the semiconductor layer serves as an incident surface for light,
   wherein the metal film is constituted of a material including nickel,
   wherein the metal film is configured to include a first film on the semiconductor layer and a second film provided to cover the first film, the first film being constituted of nickel, the second film being constituted of a material having a smaller refractive index than that of the first film, and
   wherein the semiconductor layer, the first film, and the second film, are laminated in this order.

2. The photodetector element according to claim 1, wherein the uneven structure is a periodic uneven structure which periodically has the projection portions and the recess portions.

3. The photodetector element according to claim 2, wherein the uneven structure is a periodic uneven nano structure in which the projection portions and the recess portions are formed in nano-order.

4. The photodetector element according to claim 1, wherein the metal film is provided on the one surface side of the semiconductor layer to cover the entirety of the uneven structure.

5. The photodetector element according to claim 1, wherein an insulating film is provided on a top surface of the projection portion, and
   wherein the metal film has a first part which covers a bottom surface and an inner wall surface of the recess portion and a second part which covers the insulating film.

6. The photodetector element according to claim 5,
wherein a thickness of the insulating film is equivalent to or smaller than a height of the projection portion.

7. The photodetector element according to claim 6,
wherein a refractive index of the insulating film is smaller than a refractive index of the semiconductor layer.

8. The photodetector element according to claim 5,
wherein a refractive index of the insulating film is smaller than a refractive index of the semiconductor layer.

9. The photodetector element according to claim 1,
wherein a thickness of the metal film is 20 nm or larger.

* * * * *